United States Patent [19]
Liepold et al.

[11] Patent Number: 6,081,139
[45] Date of Patent: *Jun. 27, 2000

[54] DIFFERENTIAL AMPLIFIER WITH LATERAL BIPOLAR TRANSISTOR

[75] Inventors: Carl F. Liepold; James T. Doyle, both of Chandler, Ariz.

[73] Assignee: Intel Corporation, Santa Clara, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/937,907

[22] Filed: Sep. 25, 1997

[51] Int. Cl.⁷ .............................. H03K 5/22; H03K 17/60
[52] U.S. Cl. .................................. 327/66; 327/89; 327/481
[58] Field of Search .................................. 327/63, 65, 66, 327/77, 89, 560–563, 480, 481, 432, 433, 577, 578; 257/579, 580

[56] References Cited

U.S. PATENT DOCUMENTS

| | | |
|---|---|---|
| 4,580,106 | 4/1986 | Vittoz . |
| 5,047,823 | 9/1991 | Treitinger et al. ........................ 257/559 |
| 5,467,057 | 11/1995 | Joardar ..................................... 330/254 |
| 5,580,797 | 12/1996 | Miwa et al. . |
| 5,581,104 | 12/1996 | Lowrey et al. . |
| 5,581,112 | 12/1996 | Li et al. . |
| 5,591,651 | 1/1997 | Chen . |
| 5,682,120 | 10/1997 | Ito ........................................... 330/252 |
| 5,689,087 | 11/1997 | Jack ........................................ 136/213 |

OTHER PUBLICATIONS

CMOS Voltage References Using Lateral Bipolar Transistors; by M. Degrauwe et al. 1985 IEEE pp. 1151–1157.

MOS Transistors Operated in the Lateral Bipolar Mode and Their Application in CMOS Technology; by E. Vittoz; 1983 IEEE pp. 273–279.

Micropower Switched–Capacitor Oscillator by E. Vittoz IEEE Journal of Solid State Circuits; vol. 14, No. 3; pp. 622–624.

*Primary Examiner*—Toan Tran
*Attorney, Agent, or Firm*—Blakely, Sokoloff, Taylor & Zafman LLP

[57] ABSTRACT

The present invention provides a differential amplifier. The differential amplifier includes first and second inputs and an output. The differential amplifier further includes a lateral bipolar transistor. The lateral bipolar transistor includes a well region that has a base region, an emitter region and first and second collector regions. The first and second collector regions are spaced apart from the emitter. The lateral bipolar transistor also includes a first gate, coupled to the first input, to overlay a space between the emitter region and the first collector region. Furthermore, the lateral bipolar transistor includes a second gate, coupled to the second input, to overlay a space between the emitter region and the second collector region. The differential amplifier further includes first and second load devices coupled to the first and second collector regions.

19 Claims, 2 Drawing Sheets

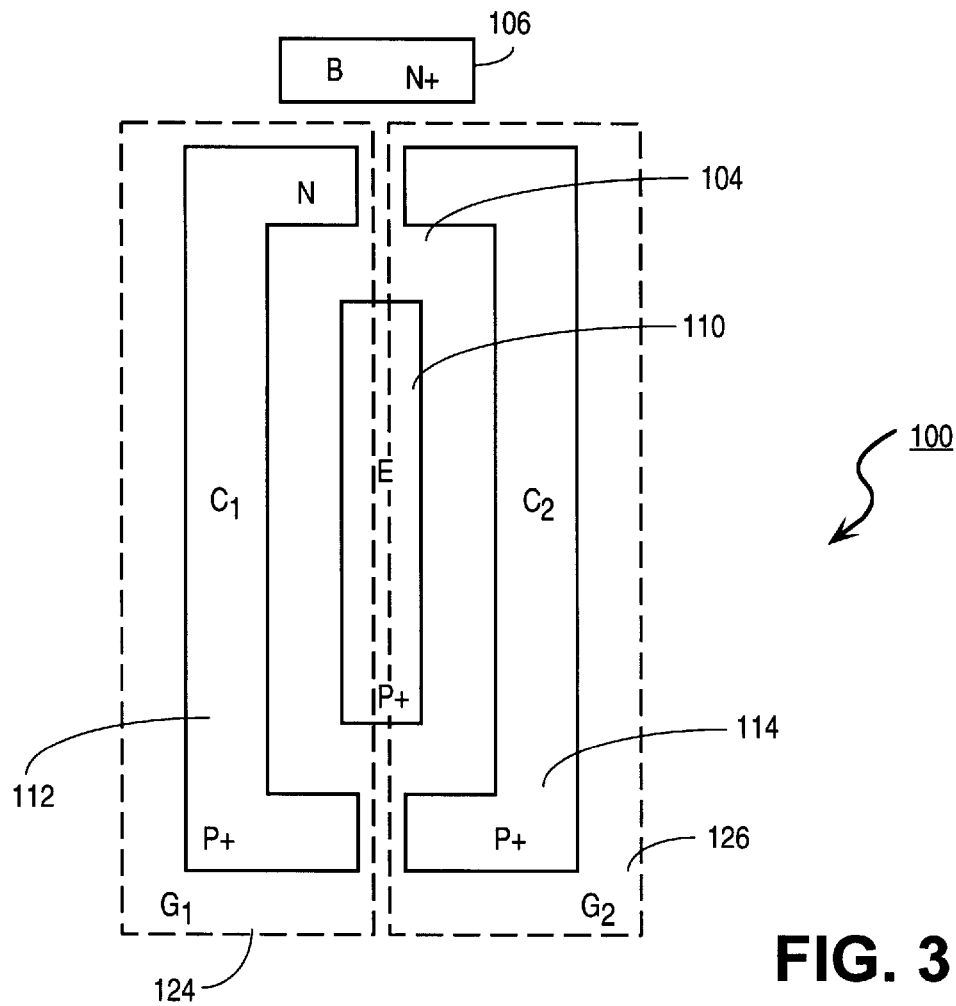
FIG. 3
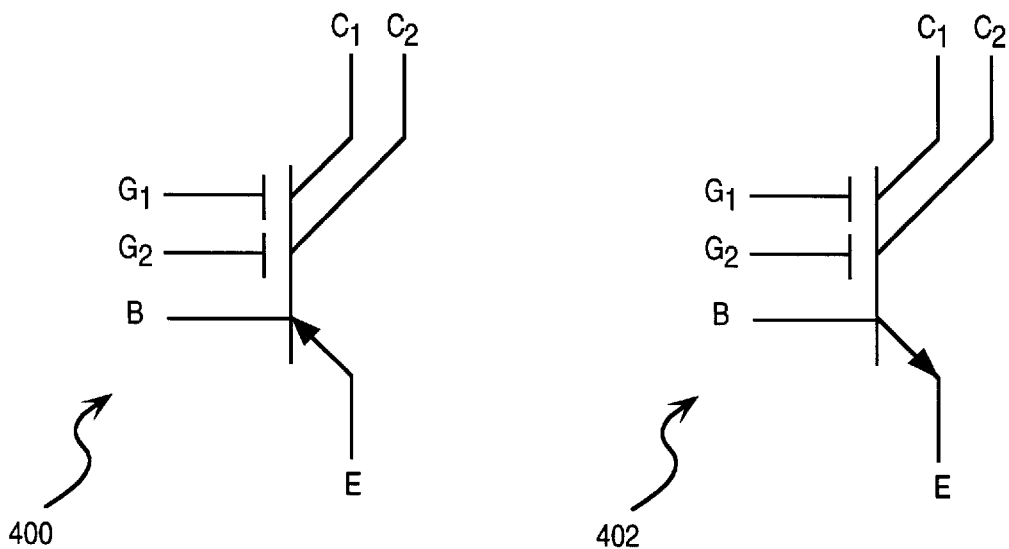
FIG. 4A  FIG. 4B

DIFFERENTIAL AMPLIFIER WITH LATERAL BIPOLAR TRANSISTOR

BACKGROUND OF THE INVENTION (1) Field of the Invention

The present invention relates to semiconductor devices. More specifically, the present invention relates to transistors and circuits utilizing transistors.

(2) Background Information

In the development of integrated electronic circuits, increased interest has been displayed in the possibility of obtaining analog functions and digital functions on the same circuit. Although, bipolar technologies are considered to be better for purely analog circuits, MOS technologies are preferred for the implementation of a digital part of a circuit. A lateral bipolar transistor is an example of a device that integrates analog and digital circuits on the same chip by combining bipolar technologies and MOS technologies.

A lateral bipolar transistor may be obtained from a bipolar transistor that has a collector not tied to the substrate. One type of lateral bipolar transistor may include an emitter, two collectors, a gate, a base and a source. By properly biasing the base, the drain and the source (emitter and collector respectively), a bipolar operating mode is obtained. Typically, the emitter-base junction is forward biased and the collector-base junction is reversed biased. Also, the gate is brought to a potential sufficiently negative (with respect to the base) to avoid inversion of the conductivity type of the zone situated between two diffusion zones constituting the collector and the emitter of the transistor. This prevents MOS transistor operation between the two diffusions which constitute the collector and emitter of the lateral bipolar transistor. To favor the lateral bipolar transistor, the gate length is typically kept small and the perimeter/surface ratio of the emitter is maximized. A discussion about MOS transistors operated in lateral bipolar mode may be found in Eric A.

Vittoz's paper, "MOS Transistors Operated in the Lateral Bipolar Mode and their Application in CMOS Technology", IEEE. Journal of Solid-State circuits, Vol. SC-18, No. 3, June 1983.

In one application, two transistors operated in a lateral bipolar mode may be used in a differential amplifier. Such differential amplifier may include a circuit with a pair (differential pair) of lateral bipolar transistors that may have their emitters connected to a current source the collector currents are defined by signals applied to the bases of the two transistors. The differential amplifier may be used to amplify the difference between two signals coupled to the bases of the two transistors operated in a lateral bipolar mode. The base-emitter voltages of the two transistors operated in a lateral bipolar mode may be changed differentially. A problem with this configuration is the mismatch between the two transistors operated in the lateral bipolar mode.

It is desirable to provide a single lateral bipolar transistor device that may be used by itself to form a differential amplifier. It is desirable that such lateral bipolar transistor exhibits better matching than the two transistors operated in a lateral bipolar mode of the above-mentioned differential amplifier.

SUMMARY OF THE INVENTION

The present invention provides a differential amplifier. The differential amplifier includes first and second inputs and an output. The differential amplifier further includes a lateral bipolar transistor. The lateral bipolar transistor includes a well region that has a base region, an emitter region and first and second collector regions. The first and second collector regions are spaced apart from the emitter. The lateral bipolar transistor also includes a first gate, coupled to the first input, to overlay a space between the emitter region and the first collector region. Furthermore, the lateral bipolar transistor includes a second gate, coupled to the second input, to overlay a space between the emitter region and the second collector region. The differential amplifier further includes first and second load devices coupled to the first and second collector regions.

BRIEF DESCRIPTION OF THE DRAWINGS

The features, aspects, and advantages of the present invention will become more fully apparent from the following Detailed Description, appended claims, and accompanying drawings in which:

FIG. 3 diagrammatically illustrates a layout of the lateral bipolar transistor according to the present invention; and FIGS. 4a, and 4b symbolically illustrate a lateral bipolar pnp transistor and a lateral bipolar npn transistor respectively according to the present invention.

DETAILED DESCRIPTION OF THE INVENTION

In the following description, numerous specific details are set forth to provide a thorough understanding of the present invention. However, one having ordinary skill in the art should recognize that the invention may be practiced without these specific details. In some instances, well-known circuits, structures, and techniques have not been shown in detail to avoid obscuring the present invention.

Figure 1:
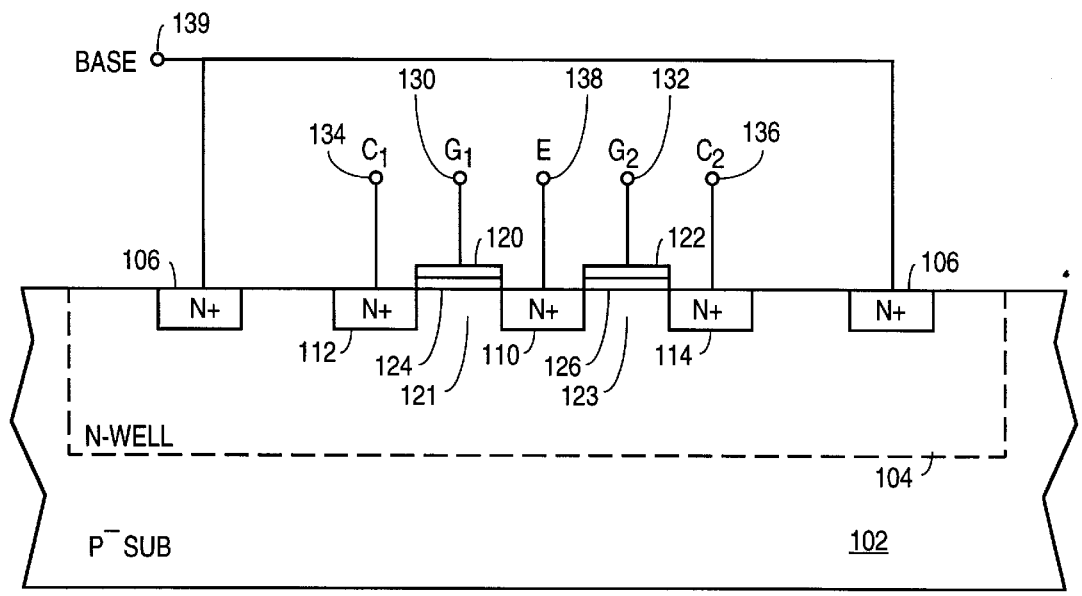
FIG. 1 illustrates a cross-sectional view of a lateral bipolar transistor according, to the present invention.

FIG. 1 illustrates a cross-sectional view of a lateral bipolar transistor 100 according to the present invention. The lateral bipolar transistor 100 is a bipolar transistor produced by way of MOS technology. Transistor 100 is formed on a p-type semiconductor substrate 102 that has a n-type well 104 formed therein, typically by a diffusion process well-known in the art. The well 104 includes a base region 106 made of a first heavily doped conductivity type semiconductor material. In one embodiment of the lateral bipolar transistor described herein, the first heavily doped conductivity type is n+. Well 104 also includes region 110 made of a second heavily doped conductivity type semiconductor material. In one embodiment of the lateral bipolar transistor according to the present invention described herein, the second heavily doped conductivity type is p+. The region 110 serves as an emitter and is coupled to an electrode 138 (E). Base region 106 is connected to a base electrode 139 (B). The n-type well 104 further includes regions 112 and 114, made of the second heavily doped conductivity type. In one embodiment of the lateral bipolar transistor according to the present invention, the second heavily doped conductivity type is "p+". Regions 112 and 114 serve as collector regions (first and second collector regions respectively) and are connected to a first collector electrode 134 (C1) and to a second collector electrode 136 (C2) respectively.

Lateral bipolar transistor 100 further includes first and second gates 120 and 122. The first gate 120 is deposited on insulating oxide 124 overlying a space 121 configured between first collector region 112 and emitter region 110. First gate 120 is coupled to first gate electrode 130 (G1). The lateral bipolar transistor 100 further includes a second gate 122 deposited onto insulating oxide 126 overlying a space 123 between emitter region 110 and second collector region 114. The second gate 122 is connected to second gate electrode 132 (G2). Gates 120 and 122 may be made of metal or of doped polycrystalline silicon.

The gate electrodes G1 and G2 are typically brought to a potential sufficiently negative (relative to the base) to avoid inversion of the conductivity type of spaces 121 and 123 situated between the diffusion zone 110 (emitter region) and diffusion zones 112 and 114 (first and second collector regions respectively). The presence of the gates polarized at a negative bias causes the creation of an accumulation layer below the gates of each transistor device. The accumulation layer pushes the flow of diffusing carriers away from the surface making the transistors, inherently formed in lateral bipolar transistor 100, operate like a bipolar transistor. Since the emitter and collectors may be analogized, to the source and drain of a MOS transistor device, inherently included in the lateral bipolar transistor 100, the source-to-drain conduction is pushed away below the surface of the device and is achieved by pure bipolar operation. It should be understood that it is possible to omit gates 120 and 122 as long as the formation of a channel in spaces 121 and 123 may be prevented. This may be accomplished, for example, by implanting p-type impurities in spaces 121 and 123.

Typically, a well-substrate junction is reverse biased. An emitter-base junction is forward biased while the collector base junctions are reverse biased thereby placing the lateral bipolar transistor 100 in forward active region. Note that the emitter and base voltages Ve and Vb for the two transistor devices, inherently formed in lateral bipolar transistor 100, are identical while collector voltages VC1 and VC2 and gate voltages VG1 and VG2 are unique to each transistor device. An advantage of lateral bipolar transistor over conventional lateral bipolar transistors is the good matching achieved between the two transistors inherently formed in lateral bipolar transistor 100.

Figure 2:
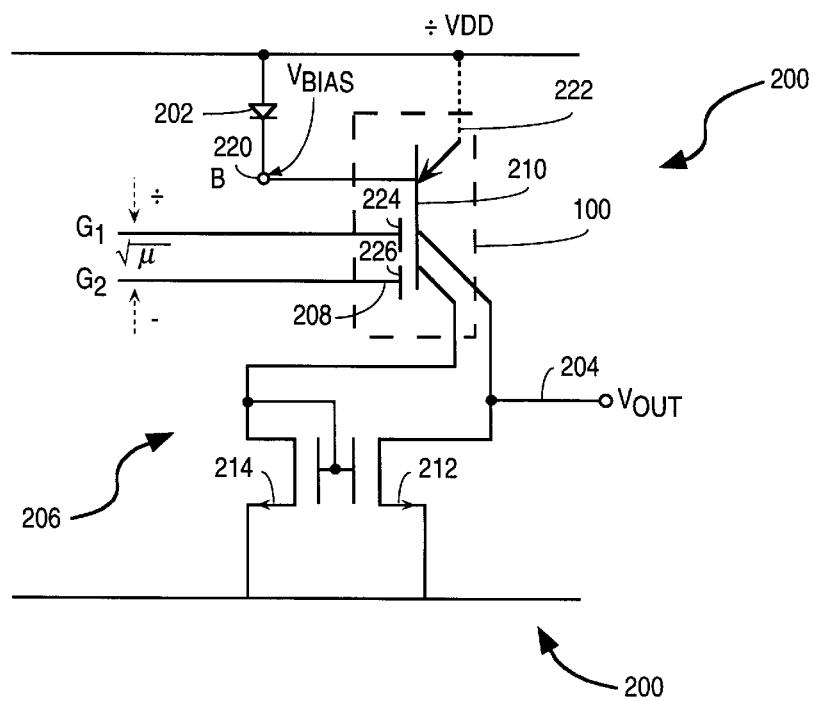
FIG. 2 illustrates a differential amplifier that includes a lateral bipolar transistor according to the present invention.

The transistor illustrated in FIG. 1 may be used as a part of a differential amplifier illustrated in FIG. 2. FIG. 2 illustrates a differential amplifier 200 that includes a lateral bipolar transistor 100 (of FIG. 1) with emitter 222 coupled to Vdd. An emitter-base junction of transistor 100 is forward biased by a diode 202 to a voltage that is approximately 0.6 volts. Gates 224 (G1) and 226 (G2) of transistor 100 are biased to a negative value that causes transistor 100 to operate in a lateral bipolar mode. Collectors 208 and 210 are biased negatively (reverse biased) with respect to base 220.

Due to the diode 202, coupled between the emitter and the base of transistor 100, the emitter current for transistor 100 and thus for the two lateral bipolar transistors inherently formed in transistor 100 is constant. Transistor 100 can be thus analogized with two lateral bipolar transistors with their emitters coupled together. A differential amplifier is thus formed with a differential pair of transistors provided by lateral bipolar transistor 100 and the active loads provided by NMOS transistors 214 and 212 of current mirror 206. It should be understood that the differential amplifier 200 may also be implemented with a load device different than current mirror 206. The current mirror 206 provides a relatively high effective collective load impedance thereby providing substantially high voltage gains. Differential amplifier 200 is substantially different from conventional differential amplifiers. Unlike in conventional differential amplifiers that include two separate bipolar transistors, where the base-emitter voltages of the two transistors are changed differentially to effect the change in the collector currents, in differential amplifier 200, the gate voltages are changed differentially.

Current mirror device 206, which provides active loads for collector currents, is coupled to the collectors 208 and 210 of the lateral bipolar transistor 100. NMOS transistors 214 and 212 of current mirror device 206 have the drains thereof coupled to collectors 208 and 210 of transistor 100. The gate and the drain of transistor 214 are coupled together. Also, the sources, of transistors 214 and 212 are coupled together preferably to the lower rail which may be ground.

A small differential signal $V_\mu$ is applied between gates G1 and G2. This signal modulates the output voltage $V_{out}$ collected at output 204 of differential amplifier 200. The lateral bipolar transistor's 100 performance may thus be varied by adjusting the gate voltages applied to gates G1 and G2 to cause a change in collectors's currents. Differential amplifier 200 thus efficiently makes use of lateral bipolar transistor 100, that incorporates the differential pair of transistors in the same well thereby achieving better matching between the differential pair.

FIG. 3 illustrates a layout of the lateral bipolar transistor 100 shown in FIG. 1. The lateral bipolar transistor 100 includes base region 106 and an emitter region 110 lying between two collector regions 112 and 114. A first polysilicon gate 124 is placed over a space between emitter 110 and collector 124. A second polysilicon gate 126 is placed over a space between emitter 110 and collector 114. The well 104 is made of n-type material, the base 106 is made of a n+ doped region and is connected to a metal-1 line (not shown) of transistor 100.

FIGS. 4a and 4b symbolically illustrate a lateral bipolar pnp transistor 400 and an npn transistor 402 according to the present invention. The pnp transistor 400 includes gates G1 and G2, collectors C1, C2 and base B and emitter E common to both transistors inherently formed in pnp transistor 400. The internal structure of transistor 400 is substantially similar to the structure of the lateral bipolar transistor 100 of which a cross-sectional view is illustrated in FIG. 1. FIG. 4b illustrates a lateral bipolar npn transistor 402 according to the present invention. The internal structure of this transistor includes n+ doped collector diffusions, C1 and C2, a n+ doped emitter diffusion E, p+ doped base contact, and a p-well, formed in a n-type substrate.

In the foregoing specification, the invention has been described with reference to specific embodiments thereof. It will however be evident that various modifications and changes can be made thereto without departing from the broader spirit and scope of the invention as set forth in the appended claims. The specification and drawings are, accordingly, to be regarded in an illustrative rather than a restrictive sense. Therefore, the scope of the invention should be limited only by the appended claims.

We claim:

1. A differential amplifier comprising:

first and second inputs and an output;

a lateral bipolar transistor including, a well region including, a base region, an emitter region, and first and second collector regions, said first and second collector regions spaced apart from said emitter, first gate, coupled to said first input, to overlay a space between said emitter region and said first collector region, a second gate, coupled to said second input, to overlay a space between said emitter region and said second collector region; and first and second load devices coupled to said first and second collector regions.

2. The differential amplifier of claim 1 wherein said first and second load devices comprise an active load.

3. The differential amplifier of claim 2 wherein said active load includes a current mirror device having first and second inputs coupled to said first and second collectors respectively and an output coupled to said output of said differential amplifier.

4. The differential amplifier of claim 1 wherein said first and second gates are driven to first and second potentials and said base is driven to a third potential, said first and second potentials being opposite, in sign, a third potential applied to said base.

5. The differential amplifier of claim 1 wherein said emitter and said base form an emitter-base junction, said emitter-base junction being forward biased.

6. The differential amplifier of claim 1 wherein said first collector and said base form first collector-base junction, said first collector base unction being reverse biased.

7. The differential amplifier of claim 1 wherein said second collector and said base form second collector-base junction, said second collector-base junction being reverse biased.

8. The differential amplifier of claim 1 wherein said base region includes a heavily doped layer of first conductivity type, said emitter region includes a heavily doped layer of a second conductivity type, and said first and second collector regions each includes a heavily doped layer of said second conductivity type.

9. The differential amplifier of claim 8 wherein said base region includes a semiconductor of n+ type, said emitter region includes a semiconductor of p+ type, and said first and second collector regions each includes a semiconductor of p+ type.

10. The differential amplifier of claim 1 wherein said well region includes a semiconductor of n-type.

11. The differential amplifier of claim 1 wherein said well is formed in a p-type substrate.

12. The differential amplifier of claim 1 wherein said lateral bipolar transistor is produced by way of CMOS technology.

13. The differential amplifier of claim 1 wherein said emitter is coupled to a positive supply voltage $V_{dd}$.

14. The differential amplifier of claim 13 further including a diode having a cathode coupled to the base and an anode coupled to the positive supply voltage.

15. The differential amplifier of claim 1 wherein a change in currents at first and second collectors is generated by applying a differential signal between first and second gates.

16. A method for amplifying a difference between first and second signals, the method comprising:

a. applying a first signal to a first gate of a lateral bipolar transistor (LBP), said LBP further including a well region with a base region, an emitter region, and first and second collector regions, spaced apart from said emitter region, said LBP further including a first gate configured to overlay said emitter region and said first collector region and a second gate configured to overlay said emitter region and said second collector region;

b. applying a second signal to said second gate of said lateral bipolar transistor; and c. driving first and second collector signals from said first and second collectors regions to first and second inputs of a current mirror device.

17. The method of claim 16 further including applying first, second, and third potentials to said first and second gate and to said base respectively, said first and second potentials being opposite, in sign, said third potential.

18. The method of claim 16 further including forward biasing an emitter-base junction formed by said emitter region and said base region.

19. The method of claim 16 further including reverse biasing first and second collector-base junctions, said first and second collector base junctions being formed by said first and second collector regions and said base region respectively.

* * * * *